(12) United States Patent
DuBose et al.

(10) Patent No.: US 11,848,789 B1
(45) Date of Patent: Dec. 19, 2023

(54) SYSTEM TESTERS FOR ANALYZING DOWNSTREAM QAM ENVIRONMENTS

(71) Applicant: VeEX Inc., Fremont, CA (US)

(72) Inventors: William Matthew DuBose, Fremont, CA (US); Michael Richard Collins, Fremont, CA (US)

(73) Assignee: VeEX Inc., Fremont, CA (US)

( * ) Notice: Subject to any disclaimer, the term of this patent is extended or adjusted under 35 U.S.C. 154(b) by 657 days.

(21) Appl. No.: 17/074,455

(22) Filed: Oct. 19, 2020

Related U.S. Application Data

(60) Provisional application No. 63/001,192, filed on Mar. 27, 2020.

(51) Int. Cl.
*H04L 1/20* (2006.01)
*G01R 31/317* (2006.01)

(52) U.S. Cl.
CPC .......... *H04L 1/206* (2013.01); *G01R 31/3171* (2013.01); *H04L 1/20* (2013.01); *H04L 1/203* (2013.01)

(58) Field of Classification Search
CPC .......... H04L 1/206; H04L 1/20; H04L 1/203; G01R 31/3171
See application file for complete search history.

(56) References Cited

U.S. PATENT DOCUMENTS

| | | | | |
|---|---|---|---|---|
| 8,614,940 B1 * | 12/2013 | Dybdal | ............... | H04J 11/0066 370/542 |
| 2008/0019331 A1 * | 1/2008 | Thomas | ............ | H04L 25/03242 370/338 |
| 2008/0062946 A1 * | 3/2008 | Jeong | ................ | H04L 25/03038 370/342 |
| 2014/0072022 A1 * | 3/2014 | Medles | ................ | H04B 17/391 375/227 |

* cited by examiner

*Primary Examiner* — Mohammad K Islam
(74) *Attorney, Agent, or Firm* — Sheppard Mullin Richter & Hampton LLP

(57) ABSTRACT

Systems, methods, and non-transitory computer readable media are configured to receive a signal. One or more data streams associated with one or more metrics associated with the signal can be determined. The one or more data streams can be sampled to generate data samples. A grade associated with the signal can be generated based on the data samples. The grade can indicate quality of the signal.

20 Claims, 6 Drawing Sheets

SYSTEM TESTERS FOR ANALYZING DOWNSTREAM QAM ENVIRONMENTS

CROSS-REFERENCE TO RELATED APPLICATIONS

This application claims priority to U.S. Provisional Patent Application No. 63/001,192, filed on Mar. 27, 2020 and entitled "SYSTEMS AND METHODS FOR GRADING CHANNEL QUALITY," which is incorporated herein by reference in its entirety.

FIELD OF THE INVENTION

The present technology relates to determining signal quality. More particularly, the present technology relates to techniques for determining signal quality in communication networks.

BACKGROUND

Evaluating quality of a signal can be complex. There can be numerous metrics associated with various aspects of a signal. For example, metrics such as modulation error ratio, bit error ratio, and power level can be used to describe some aspects of the signal. The modulation error ratio can indicate performance of the signal. The bit error ratio can indicate accuracy of binary patterns encoded in the signal. The power level can indicate a signal strength of the signal at a particular spot or location.

Conventional techniques can utilize these metrics to provide a field engineer or technician only crude assessments about signal quality. For example, under some conventional techniques, the metrics may inform merely whether the signal is "passing" or not. Accordingly, these conventional techniques can fail to provide a more detailed assessment about signal quality that can better inform the field engineer or technician to take appropriate action to improve signal quality, as appropriate.

SUMMARY

Various embodiments of the present technology can include systems, methods, and non-transitory computer readable media configured to receive a signal. One or more data streams associated with one or more metrics associated with the signal can be determined. The one or more data streams can be sampled to generate data samples. A grade associated with the signal can be generated based on the data samples. The grade can indicate quality of the signal.

In some embodiments, the one or more data streams can be provided for display through an interface. The grade associated with the signal can be provided for display through the interface.

In some embodiments, the interface can include one or more data fields and one or more plots. At least one data field of the one or more data fields can correspond to at least one metric of the one or more metrics associated with the signal and at least one plot of the one or more plots can correspond to the grade associated with the signal.

In some embodiments, the one or more metrics associated with the signal can include at least one of modulation error ratio, pre-bit error ratio, post-bit error ratio, or power level associated with the signal.

In some embodiments, the pre-bit error ratio can include bit errors that can be corrected by error correction and the post-bit error ratio can include bit errors that cannot be corrected by error correction.

In some embodiments, the error correction can include cyclic redundancy check.

In some embodiments, statistical values corresponding to the modulation error ratio and the power level can be computed based on the data samples. The statistical values can comprise at least one of an average, a standard deviation, or a minimum value. A modulation error ratio degradation score for the modulation error ratio and a power level degradation score for the power level can be computed based at least in part on the statistical values corresponding to the modulation error ratio and the power level.

In some embodiments, values corresponding to the pre-bit error ratio and the post-bit error ratio can be measured. Pre-bit errors or post-bit errors associated with the data samples can be determined. A bit error ratio degradation score can be computed based at least in part on the values corresponding to the pre-bit error ratio and the post-bit error ratio, and the pre-bit errors or the post-bit errors.

In some embodiments, the grade associated with the signal can be assigned based on a letter grading scheme comprising A+, A, A−, B+, B, B−, C+, C, C−, D+, D, D−, and F.

In some embodiments, the signal can include an orthogonal frequency division multiplexing signal modulated using at least one of a 64-state quadrature amplitude modulation or a 256-state quadrature amplitude modulation.

It should be appreciated that many other features, applications, embodiments, and/or variations of the present technology will be apparent from the accompanying drawings and from the following detailed description. Additional and/or alternative implementations of the structures, systems, non-transitory computer readable media, and methods described herein can be employed without departing from the principles of the present technology.

Figure 1:
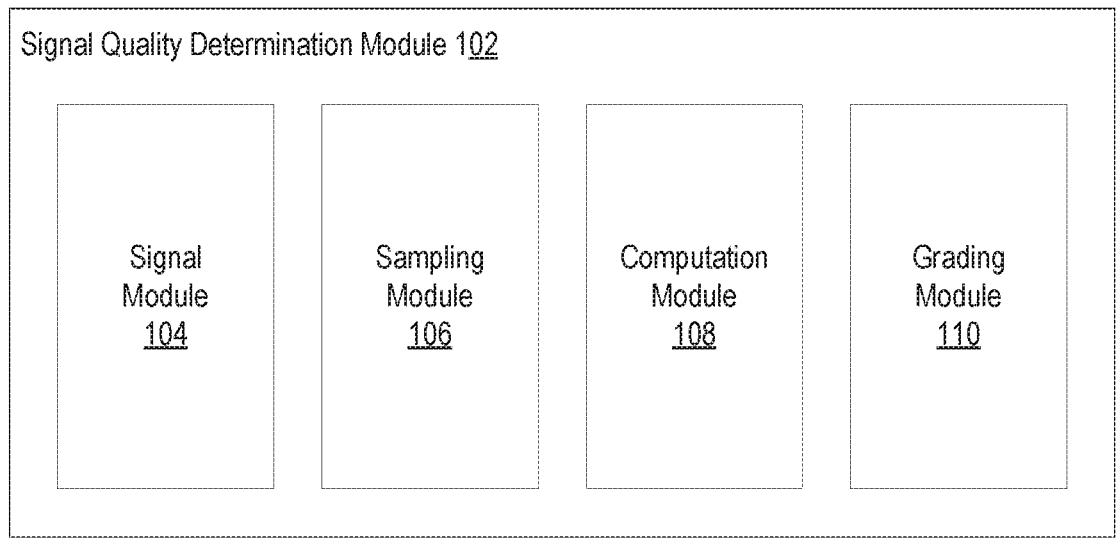
FIG. 1 illustrates an example system including a signal quality determination module, according to various embodiments of the present technology.
Figure 1:
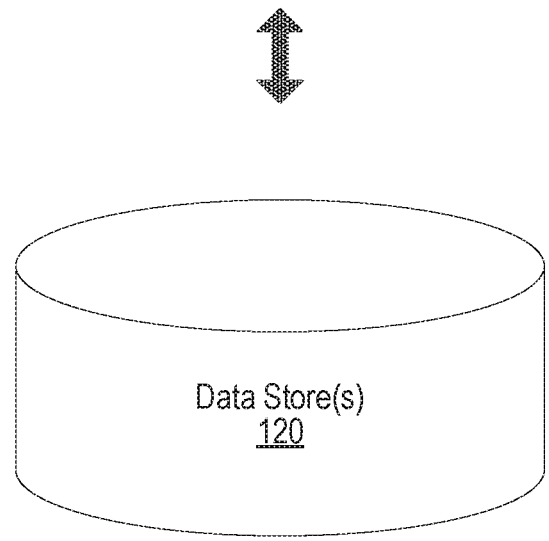

The figures depict various embodiments of the present technology for purposes of illustration only, wherein the figures use like reference numerals to identify like elements. One skilled in the art will readily recognize from the following discussion that alternative embodiments of the structures and methods illustrated in the figures can be employed without departing from the principles of the present technology described herein.

DETAILED DESCRIPTION

Approaches for Analyzing Downstream QAM Environments

Evaluating quality of a signal can be complex. There can be numerous metrics associated with various aspects of a signal. For example, metrics such as modulation error ratio, bit error ratio, and power level can be used to describe some aspects of the signal. The modulation error ratio can indicate performance of the signal. The bit error ratio can indicate accuracy of binary patterns encoded in the signal. The power level can indicate a signal strength of the signal at a particular spot or location.

Conventional techniques can utilize these metrics to provide a field engineer or technician only crude assessments about signal quality. For example, under some conventional techniques, the metrics may inform merely whether the signal is "passing" or not. Accordingly, these conventional techniques can fail to provide a more detailed assessment about signal quality that can better inform the field engineer or technician to take appropriate action to improve signal quality, as appropriate.

The present technology is an improved approach rooted in computer technology that overcomes the foregoing and other disadvantages associated with the conventional methods described above. In various embodiments, a computing system (or a computing device) can be configured to receive a signal from a signal source to analyze quality of the signal. The signal, in some embodiments, can be a digital signal from a content receiver (e.g., a satellite dish receiver, a cable node, etc.) in a communication network. In some embodiments, the computing system can generate one or more data streams corresponding to one or more metrics associated with the signal as the signal is received. The one or more metrics can include, for example, modulation error ratio (MER), bit error ratio (BER), and power level associated with the signal. While MER, BER, and power level associated with a signal are discussed herein as examples of metrics, the present technology can apply equally to other metrics relating to other attributes or aspects associated with the signal. In some embodiments, the one or more data streams can include information (e.g., data) describing the one or more metrics associated with the signal. For example, a data stream can include information describing MER, BER, or power level of a signal. In some embodiments, the computing system can provide one or more metrics associated with a signal for display on an interface (e.g., a user interface) of a display screen associated with the computing system. In such embodiments, the interface can display the one or more metrics alongside or adjacent to a display of the signal. In some embodiments, the computing system can determine a grade of the signal based on data samples sampled from the one or more data streams associated with the one or more metrics associated with the signal. In such embodiments, the computing system can compute a metric degradation score for each of the one or more metrics based on the data samples and determine the grade of the signal based on the metric degradation scores. For example, a grade of a signal can be determined based on a MER degradation score, a BER degradation score, and a power level degradation score of the signal. The MER degradation score, the BER degradation score, and the power level degradation score can be determined based on various techniques. In various embodiments, a grade of a signal can be represented conceptually, qualitatively, or quantitatively. In some embodiments, a grade of a signal can be represented by any suitable alphanumeric characters in any suitable sequence or order. For example, in some embodiments, a grade of a signal can be represented as a letter grade A+, A, A−, B+, B, B−, C+, C, C−, D+, D, D−, or F. In this example, a grade of A+indicates best signal quality and a grade of F indicates worst signal quality. More details relating to the present technology are provided below.

FIG. 1 illustrates an example system 100 including a signal quality determination module 102, according to various embodiments of the present technology. The signal quality determination module 102 can be configured to receive a signal from a signal source (e.g., a satellite dish receiver, a cable node, etc.) and determine a grade of the signal based on one or more metrics associated with the signal. As shown in FIG. 1, in some embodiments, the signal quality determination module 102 can include a signal module 104, a sampling module 106, a computation module 108, and a grading module 110. In some embodiments, the example system 100 can further include at least one data store 120 that is accessible by the signal quality determination module 102. The at least one data store 120 can be configured to store and maintain various types of data. For example, in some embodiments, the at least one data store 120 can store information associated with the signal module 104, the sampling module 106, the computation module 108, and the grading module 110. For instance, the at least one data store 120 can store information relating to data samples sampled from one or more data streams, statistical values of one or more metrics computed based on data samples, one or more metric degradation scores, etc. The components (e.g., modules, elements, etc.) shown in this figure and all figures herein are exemplary only, and other implementations may include additional, fewer, integrated, or different components. Some components may not be shown so as not to obscure relevant details. In various embodiments, one or more of the functionalities described in connection with the signal quality determination module 102 can be implemented in any suitable combinations.

The signal module 104 can be configured to receive a signal from a signal source. A signal source can be a satellite dish receiver or a cable node connected to a cable network (e.g., a coaxial cable network), for example. A signal from a signal source may carry data associated with content providers (e.g., television programming providers). For example, a signal may carry data associated with television programming. In some cases, a signal from a signal source may carry data relating to internet browsing or associated with internet service providers. For example, a signal may carry data relating to general web surfing, downloading content, uploading content, streaming content, etc.

In some embodiments, a signal (e.g., a digital signal) received by the signal module 104 may comprise a series of binary values such as zeros and ones. In some cases, a signal may be modulated using various modulation schemes or formats. For example, a signal may be modulated using orthogonal frequency division multiplexing (OFDM). In general, OFDM allows for high data throughput and data rate in communication networks because OFDM combines quadrature amplitude modulation (QAM) and frequency division multiplexing (FDM). In some embodiments, QAM may include different modulation types such as binary phase shift keying (BPSK), quadrature phase shift keying (QPSK), 16-state QAM (16 QAM), 64-state QAM (64 QAM), and 256-state QAM (256 QAM). For example, an OFDM signal relating to television programming may be modulated in 64 QAM or 256 QAM.

In some embodiments, the signal module 104 can demodulate a signal received from a signal source so that signal patterns (e.g., binary patterns) encoded in the signal can be decoded or recovered. Once demodulated, the signal module 104 can determine various metrics associated with the signal. These metrics can include, for example, modulation error ratio (MER), pre-bit error ratio (pre-BER), post-bit error ratio (post-BER), and power level. As an example, in some embodiments, the signal module 104 can demodulate a digital signal (e.g., an OFDM signal) from a satellite dish receiver and determine MER, pre-BER, post-BER, and power level associated with the digital signal. In general, MER is a measure of modulation performance of a signal. MER can be measured based on a ratio of a power of the signal to a power of an error in the signal. A high MER indicates low levels of impairments (e.g., interferences) and high signal performance. Whereas a low MER indicates high levels of impairments and low signal performance. Bit error ratio (BER) is a measure of errors in a signal. BER can be measured based on a number of bit errors per unit of measure. For example, assume that a transmitter transmits a digital signal comprising a bit pattern of 1010101010 to a receiver. Assume further that, when the receiver receives the digital signal, the bit pattern changed from 1010101010 to 1010001010. In this example, BER of the digital signal is one bit error for every ten bits of data or, in other words, BER is 0.1 or 10% or 1 e-1 when expressed in scientific notation. Therefore, a high BER indicates a high number of bit errors in a signal and a low BER indicates a low number of bit errors in a signal. Pre-BER refers to bit errors that can be corrected and post-BER refers to bit errors that cannot be corrected. Pre-BER and post-BER will be discussed in greater detail below. Power level is a measure of power (e.g., signal strength) of a signal. Power level is usually expressed in decibels in relation to a reference power level. In some embodiments, MER, pre-BER, post-BER, and power level can be used to assess quality of a signal.

In some embodiments, the signal module 104 can correct bit errors in a signal. As discussed, a signal such as a digital signal received by the signal module 104 may comprise a series of binary values of zeros and ones. The signal module 104, in some embodiments, can arrange these binary values into a plurality of data frames of a fixed binary length. For example, the signal module 104 can arrange a series of binary values into a plurality of data frames with each data frame having a length of sixteen bits. In some cases, a portion of binary values in a data frame may be reserved for error correction and may be used by the signal module 104 to correct bit errors in the data frame. For example, two bits in a sixteen-bit data frame may be reserved for error correction. In this example, the signal module 104 may use these two bits to correct the remaining fourteen bits of data in the data frame. In some embodiments, error correction may be implemented as cyclic redundancy check (CRC) and a portion of binary values reserved for error corrections is known as CRC bits. Not all bit errors in data frames can be corrected by error correction. When bit errors in a data frame cannot be corrected by the signal module 104 using error correction, the data frame will be corrupted and may result in degradation of signal quality. For example, corrupt data frames relating to a signal carrying television programming may manifest as pixelated video images or frames. In some embodiments, the signal module 104 can identify bit errors in a signal that can be corrected by error correction as pre-bit errors and bit errors in a signal that cannot be corrected by error correction as post-bit errors. The signal module 104 can associate the pre-bit errors as pre-BER and the post-bit errors as post-BER.

In some embodiments, the signal module 104 can generate one or more data streams corresponding to one or more metrics associated with a signal. Each data stream can be associated with a metric associated with the signal. For example, as the signal module 104 receives and processes a signal, the signal module 104 can generate four data steams with each data stream representing MER, pre-BER, post-BER, and power level of the signal, respectively. In some embodiments, the signal module 104 can display one or more data streams on a display screen through an interface (e.g., a user interface) associated with a computing system (or a computing device). In such embodiments, the signal module 104 can display the one or more data streams through the interface in real or near real time as the signal is received. For example, data streams of MER, pre-BER, post-BER, and power level of a signal can be displayed adjacent to the signal through an interface of a computing system as the signal module 104 receives and processes the signal. The interface will be discussed in greater detail in reference to FIG. 3 below.

The sampling module 106 can be configured to sample (e.g., collect data samples from) one or more data streams associated with one or more metrics of a signal at various sampling rates. In general, a data sample of a data stream corresponds to data of the data stream at the time the data stream is sampled. For example, the sampling module 106 can sample a data stream relating to pre-BER (or post-BER) of a digital signal at a sampling rate of one data sample per second (e.g., 1 Hz). In this example, the data stream may toggle between values of 1e-3 (e.g., one bit error for every one thousand bits) and 3e-3 (e.g., three bit error for every one thousand bits) every second. Accordingly, in this example, a first data sample sampled by the sampling module 106 has a value of 1e-3, a second data sample has a value of 3e-3, a third data sample has a value of 1e-3, a fourth data sample has a value of 3e-3, and so on. In some embodiments, a sampling rate can be selected based, for example, on a period of time or a number of data samples. In some embodiments, the sampling rate can be adjusted based on user inputs by a user of the computing system. For example, the sampling module 106 can sample a data stream associated with MER of a signal at a sampling rate of fifty data samples per second (e.g., 50 Hz). A user can provide an instruction through the interface to change the sampling rate from fifty data samples per second (e.g., 50 Hz) to one hundred data samples per second (e.g., 100 Hz). Upon receipt of the instruction, the sampling module 106 can change the sampling rate accordingly.

In some embodiments, the sampling module 106 can sample a data stream at a particular sampling rate indefinitely or sample the data stream for a selected amount of time. In some cases, the sampling module 106 can sample a data stream at a particular sampling rate for a fixed or a selected number of data samples. For example, the sampling module 106 can be configured to sample a data stream at a sampling rate of 1 Hz for one hundred data samples. In this example, the sampling module 106 automatically stops sampling once one hundred data samples are sampled by the sampling module 106.

The computation module 108 can be configured to compute or calculate statistical values relating to one or more metrics associated with a signal. As discussed herein, the statistical values can be used to generate a grade indicative of quality of the signal. In some embodiments, the computation module 106 can compute statistical values relating to one or more metrics associated with a signal based on data samples from one or more data streams associated with the one or more metrics. The statistical values can include, for example, an average, a standard deviation, a maximum value, or a minimum value. For example, the computation module 108 can compute statistical values for MER of a signal based on data samples from a data stream associated with MER of the signal. In this example, the statistical values for MER of the signal can include computations of an average, a standard deviation, a maximum MER value, and a minimum MER value. The computation module 108 can likewise compute statistical values for BER and power level of the signal.

In some embodiments, the computation module 108 can compute or calculate statistical values of a metric based on various numbers of data samples. For example, the computation module 108 can compute an average, a standard deviation, a maximum value, and a minimum value for power level of a signal based on one hundred data samples. As another example, the computation module 106 can compute an average, a standard deviation, a maximum value, and a minimum value for power level of a signal based on one thousand data samples. Many variations are possible. In general, a statistical value relating to a metric is relatively more accurate when more data samples are used in computing the statistical value, and the statistical value is relatively less accurate when fewer data samples are used in computing the statistical value.

The grading module 110 can be configured to determine a grade indicative of a level or measure of quality of a signal. In various embodiments, the grade can be conceptual, qualitative, quantitative, or a combination thereof. In some embodiments, a grade of a signal can be indicated through a grading scheme having, for example, suitable characters (e.g., alphanumeric) that can reflect a level or measure of signal quality. For example, a grading scheme for a signal may comprise numbers arranged from ten to one, with ten indicating best signal quality and one indicating worst signal quality. As another example, in a letter grading scheme, a grading scheme for a signal may comprise A+, A, A−, B+, B, B−, C+, C, C−, D+, D, D−, and F, with A+ indicating best signal quality and F indicating worst signal quality. Many variations are possible.

In some embodiments, the grading module 110 can determine a grade of signal quality based on one or more metric degradation scores. A metric degradation score is a score that measures degradation to a metric of a signal. For example, a MER degradation score measures a degree of degradation of or to MER of a signal caused by various types of interference. A metric degradation score can be computed or calculated based on statistical values of an associated metric. For instance, a MER degradation score of a signal can be computed or calculated based on an average, a standard deviation, a maximum value of MER, or a minimum value of MER for that signal. In some embodiments, the grading module 110 can determine one or more metric degradation scores using different computations. The computations from which the one or more metric degradation scores are determined can differ based on types of metrics involved. For example, a computation from which a MER degradation score is determined may be different from computations from which a BER degradation score and a power level degradation score are determined.

In some embodiments, the grading module 110 can compute a MER degradation score of a signal as follows:

$$MERDeg = MIN(MAX((StdDevMERDeg + AvgMERDeg), MinMERDeg), Max\_MERDeg)$$

where MERDeg is the MER degradation score, StdDevMERDeg is a scaled standard deviation of MER, Avg-MERDeg is a scaled average of MER, MinMERDeg is a scaled minimum value of MER, and Max_MERDeg is a numeric constant derived empirically by trial and error. In some embodiments, Max_MERDeg has a value of forty (40). As indicated in the equation above, the MER degradation score (MERDeg) is computed by first determining a maximum (or greater) value between 1) the scaled minimum value of MER (MinMERDeg) and 2) a sum (i.e., addition) of the scaled standard deviation of MER (StdDevMERDeg) and the scaled average of MER (AvgMERDeg). Then, a minimum (or lesser) value between 1) the determined maximum value and 2) the numeric constant (Max_MERDeg) (e.g., 40) is determined. The determined minimum value is the MER degradation score (MERDeg). The scaled standard deviation of MER (StdDevMERDeg) can be computed as follows:

$$StdDevMERDeg = MIN((StdDevMER * SD\_Scalar), Max\_StdDevDeg)$$

where StdDevMER is a standard deviation of MER, SD_Scalar is a scalar determined empirically by trial and error, and Max_StdDevDeg is a constant determined empirically by trial and error. In some embodiments, SD_Scalar has a value of fifty (50). In some embodiments, Max_StdDevDeg has a value of fifteen (15). The scaled average of MER (AvgMERDeg) can be computed as follows:

$$AvgMERDeg = (MER\_Base - AvgMER) * Avg\_Scalar$$

where AvgMERDeg is the scaled average of MER, MER_Base is a MER base constant determined empirically by trial and error, AvgMER is an average of MER, and Avg_Scalar is a scalar determined empirically by trial and error. In some embodiments, MER_Base has a value of forty-three (43) for signals modulated in 256 QAM. In other embodiments, MER_Base has a value of forty (40) for signals modulated in 64 QAM. In some embodiments, Avg_Scalar has a value of four (4). The scaled minimum value of MER (MinMERDeg) can be computed as follows:

$$MinMERDeg = (MER\_Base - MinMER) * Min\_Scalar$$

where MinMERDeg is the scaled minimum value of MER, MER_Base is the MER base constant, MinMER is a minimum value of MER, and Min_Scalar is a scalar. As discussed, in some embodiments, MER_Base has a value of forty-three (43) for signals modulated in 256 QAM. In other embodiments, MER_Base has a value of forty (40) for signals modulated in 64 QAM. In some embodiments, Min_Scalar has a value of two (2). The computation for MinMERDeg applies when MinMER is less than MER_Base. That is, the scaled minimum value of MER is computed when the minimum value of MER is less than forty-three (43) for signals modulated in 256 QAM and when the minimum value of MER is less than forty (40) for signals modulated in 64 QAM. In other cases, the scaled minimum value of MER is zero (0).

In some embodiments, the grading module 110 can compute a BER degradation score of a signal as follows:

$$ErrDeg = Min\_Deg + IntErrDeg$$

where ErrDeg is the BER degradation score, Min_Deg is a constant, and IntErrDeg is an interim BER degradation score. In some embodiments, Min_Deg has a value of sixty (60) when post-BER of a signal is non-zero (i.e., bit errors that cannot be corrected by error correction are present in the signal). In other embodiments, Min_Deg has a value of forty (40) when post-BER of a signal is zero (0) but pre-BER of the signal is non-zero (i.e., bit errors that cannot be corrected by error correction are not present in the signal but bit errors that can be corrected by error correction are present in the signal). The interim BER degradation score (IntErrDeg) can be computed as follows when total BER (i.e., a sum of pre-BER and post-BER) is greater than or equal to four (4):

IntErrDeg=(9−ErrFactor)*BER_Scalar where IntErrDeg is the interim BER degradation score, ErrFactor is a scientific notation factor corresponding to total BER, and BER_Scalar is a scalar. In some embodiments, BER_Scalar has a value of eight and a half (8.5). Total BER can be determined by summing (i.e., adding) pre-BER and post-BER of a signal. For example, if a signal has pre-BER of 7e-5 (i.e., seven bit errors for every one hundred thousand bits) and post-BER of 1e-5 (i.e., one bit error for every one hundred thousand bits), total BER for the signal would be 8e-5. The scientific notation factor is the absolute value of the digit (e.g., number) that comes after the "e" expression in total BER. For example, a scientific notation factor for the total BER (i.e., 8e-5) discussed above is five (5). The interim BER degradation score (IntErrDeg) can be computed as follows when total BER (i.e., sum of pre-BER and post-BER) is less than four (4):

IntErrDeg=NumErrSam*ErrSam_Scalar where NumErrSam is a number of data samples that includes pre-bit errors or post-bit errors and ErrSam_Scalar is a scalar. In some embodiments, ErrSam_Scalar has a value of five (5).

In some embodiments, the grading module 110 can compute a power level degradation score of a signal as follows:

PowLvlDeg=MIN((StdDevPowLvl*SD_Scalar), Max_StdDevDeg)

where PowLvlDeg is the power level degradation score, StdDevPowLvl is a standard deviation of power level, SD_Scalar is a scalar determined empirically by trial and error, and Max_StdDevDeg is a constant determined empirically by trial and error. In some embodiments, SD_Scalar has a value of fifty (50). In some embodiments, Max_StdDevDeg has a value of fifteen (15). As indicated in the equation above, the power level degradation score (PowLvlDeg) is computed by determining the minimum (or lesser) value between 1) Max_StdDevDeg and 2) a product (i.e., multiplication) of the standard deviation of power level (StdDevPowLvl) and SD_Scalar. The determined minimum value is the power level degradation score (PowLvlDeg).

Based on computation of one or more metric degradation scores of a signal, the grading module 110 can determine an overall score of the signal from which a grade of signal quality can be determined. In some embodiments, the grading module 110 can determine an overall score of a signal relating to signal quality as follows:

OverallScore=100−MAX(MERDeg, BERDeg, PowLvlDeg)

where OverallScore is the overall score of the signal, MERDeg is the MER degradation score of the signal, BERDeg is the BER degradation score of the signal, and PowLvlDeg is the power level degradation score of the signal. The overall score of the signal is computed by subtracting the maximum degradation score of the three degradation scores (i.e., MERDeg, BERDeg, PowLvlDeg) from one hundred (100). The resulting number is the overall score. For example, a MER degradation score, a BER degradation score, and a power level degradation score of a signal can be ten (10), fifteen (15), and twenty (20), respectively. In this example, the maximum degradation score is the power level degradation score which is twenty (20). Accordingly, in this example, an overall score of the signal is eighty (80), which is twenty (20) subtracted from one hundred (100). While the computation of the overall score has been discussed above in relation to some embodiments, the overall score can be computed in other manners in other embodiments. For example, the aforementioned values, variables, constants, and operations referenced above in the computation of the overall score can be variously eliminated, changed, replaced, or reordered in other computations of overall scores in other embodiments.

As discussed, the grading module 110 can be configured to determine a grade indicative of signal quality. In some embodiments, the grading module 110 can determine a grade of a signal based on an overall score of the signal. In some embodiments, the grade can be assigned as a letter grade. For example, an overall score of one hundred (100) can correspond to a letter grade of A+ and an overall score of forty (40) can correspond to a letter grade of F. In some embodiments, the grading module 110 can determine a grade based on a modified letter grade scheme. Unlike the traditional letter grade scheme in which an A can be in a range of ninety (90) to one hundred (100), a B can be in a range of eighty (80) to eighty-nine (89), and so on, in the modified letter grade scheme, each letter grade is assigned based on increments other than ten. For example, a modified letter grade scheme may be based on increments of any value, such as seven. A table of a modified letter grade scheme based on increments of seven is shown below:

| Overall Score | Letter Grade |
| --- | --- |
| 85+ | A+ |
| 78-84 | A |
| 71-77 | A− |
| 64-70 | B+ |
| 57-63 | B |
| 50-56 | B− |
| 43-49 | C+ |
| 36-42 | C |
| 29-35 | C− |
| 22-28 | D+ |
| 15-21 | D |
| 8-14 | D− |
| 1-7 | F |

As shown by the table, an overall score of seventy (70) corresponds to a letter grade B+ under the modified letter grade scheme. An overall score of eighty-seven (87) corresponds to a letter grade A+ under the modified letter grade scheme. Although one particular grading scheme is discussed here, there can be many other grading schemes. For example, instead of letter grades, Roman numerals (e.g., I, II, III, IV, V, etc.) can be used to denote signal quality. As another example, Greek letters (e.g., α, β, γ, etc.) can be used to denote signal quality. In some cases, a grading scheme can be adapted to reflect different grading customs used in different regions of the world.

Figure 2:
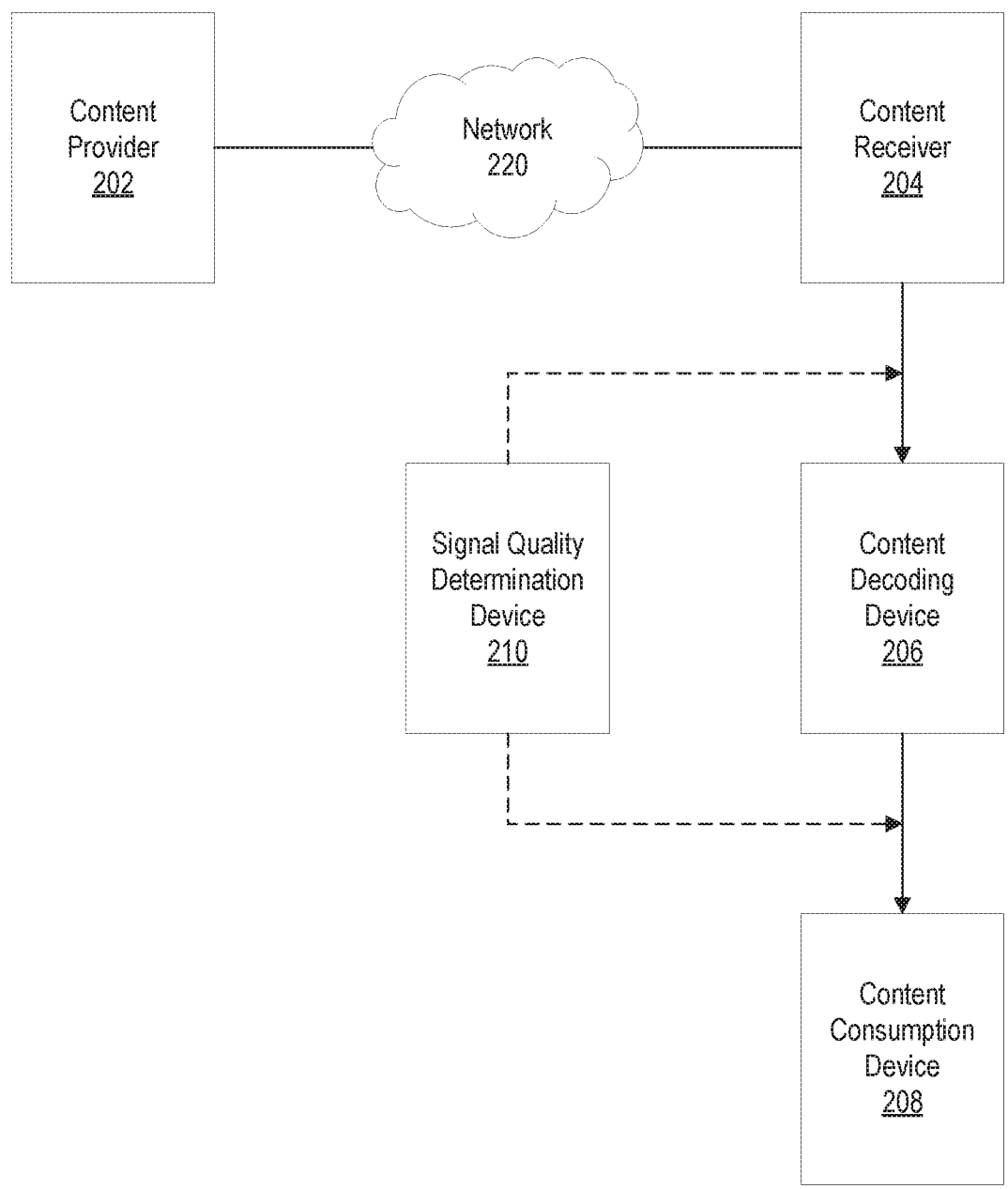
FIG. 2 illustrates an example diagram depicting an application of a signal quality determination device, according to various embodiments of the present technology.

FIG. 2 illustrates an example diagram 200 depicting an application of a signal quality determination device 210, according to various embodiments of the present technology. The signal quality determination device 210 can be a computing system or computing device. As shown in FIG. 2, in some embodiments, the example diagram 200 can include a content provider 202, a content receiver 204, and a network 220 that communicatively couples the content provider 202 to the content receiver 204. In some embodiments, the content provider 202 may be a programming provider and the content receiver 204 may be a signal receiver that receives signals from the content provider 202 over the network 220. For example, the content provider 202 may be a cable television provider and the content receiver 204 may be a satellite dish receiver or a cable node that receives data relating to television programming over the network 220. In some embodiments, the network 220 can be a satellite network. In some cases, the network 220 can be a cable network (e.g., a coaxial cable network). In some embodiments, the example diagram 200 can further include a content decoding device 206 and a content consumption device 208. The content decoding device 206 can be a device (e.g., a cable set-top box, a cable television/internet gateway, etc.) that receives and decodes signals from the content receiver 204. The content decoding device 206 can provide decoded signals (e.g., television programming, internet traffic, etc.) to the content consumption device 208 (e.g., a television, a mobile phone, a tablet, etc.) for consumption by a user. The decoded signals can be provided over a wired or a wireless connection (e.g., Wi-Fi, 802.11, etc.).

As discussed, in some cases, quality of a signal received by the content decoding device 206 can be difficult to evaluate. For example, poor signal quality may manifest as pixelated video images or frames on the content consumption device 208. In this example, a field engineer or technician may not know how to evaluate signal quality. In such cases, the signal quality determination device 210 can be utilized by a field engineer or technician to determine a grade of the signal, the grade indicating quality of the signal. The grade allows the field engineer or technician to quickly assess signal quality and determine what is causing the poor signal. In various embodiments, the signal quality determination device 210 can include the signal quality determination module 102 and implement the functionalities of the signal quality determination module 102 discussed in reference to FIG. 1. For example, the signal quality determination device 210 can generate one or more data streams associated with one or more metrics of a signal between the content receiver 204 and the content decoding device 206. These metrics can include MER, pre-BER, post-BER, and power level. The one or more data streams can be sampled by the signal quality determination device 210 to determine statistical values relating to the one or more metrics. The signal quality determination device 210 can compute, based on the statistical values, a metric degradation score for each metric of the signal and, based on metric degradation scores, determine a grade of the signal. Once the grade is determined, the signal quality determination device 210 can display the grade and the one or more metrics to the field engineer or technician through an interface associated with the signal quality determination device 210. In some embodiments, instead of or in addition to determining a quality of a signal between the content receiver 204 and the content decoding device 206, the signal quality determination device 210 can be utilized by the field engineer or technician to determine a quality of a signal between the content decoding device 206 and the content consumption device 208.

For example, a field engineer employed by a cable television provider may be called to investigate poor signal quality reported by a customer of the cable television provider. The customer may complain that the poor signal quality is causing pixelated video images from a cable box used by the customer. Under conventional approaches, the field engineer can rely on a range of "passing" values for various metrics of a signal going to the cable box. As long as the various metrics of the signal are within the range of "passing" values, the field engineer would determine that the signal is of a "passing" quality. Under conventional approaches, the poor signal quality reported by the customer may be associated with metrics that fall within the range of "passing" values. Since the metrics are "passing," the field engineer, under conventional approaches, may be at a loss as to how to improve the poor signal quality. In contrast to such conventional approaches, the present technology allows the field engineer, based on the signal quality determination device 210, to determine a specific grade associated with the signal. For example, the grade may be a B+. Based on the grade, in this example, the field engineer can then take steps to improve the grade of the signal to an A−, A, or A+. Thus, based on the signal quality determination device 210, the field engineer is able to determine signal quality with appropriate granularity so that a level of poor signal quality reported by the customer can be identified and improved to achieve a selected or desired level of signal quality.

Figure 3:
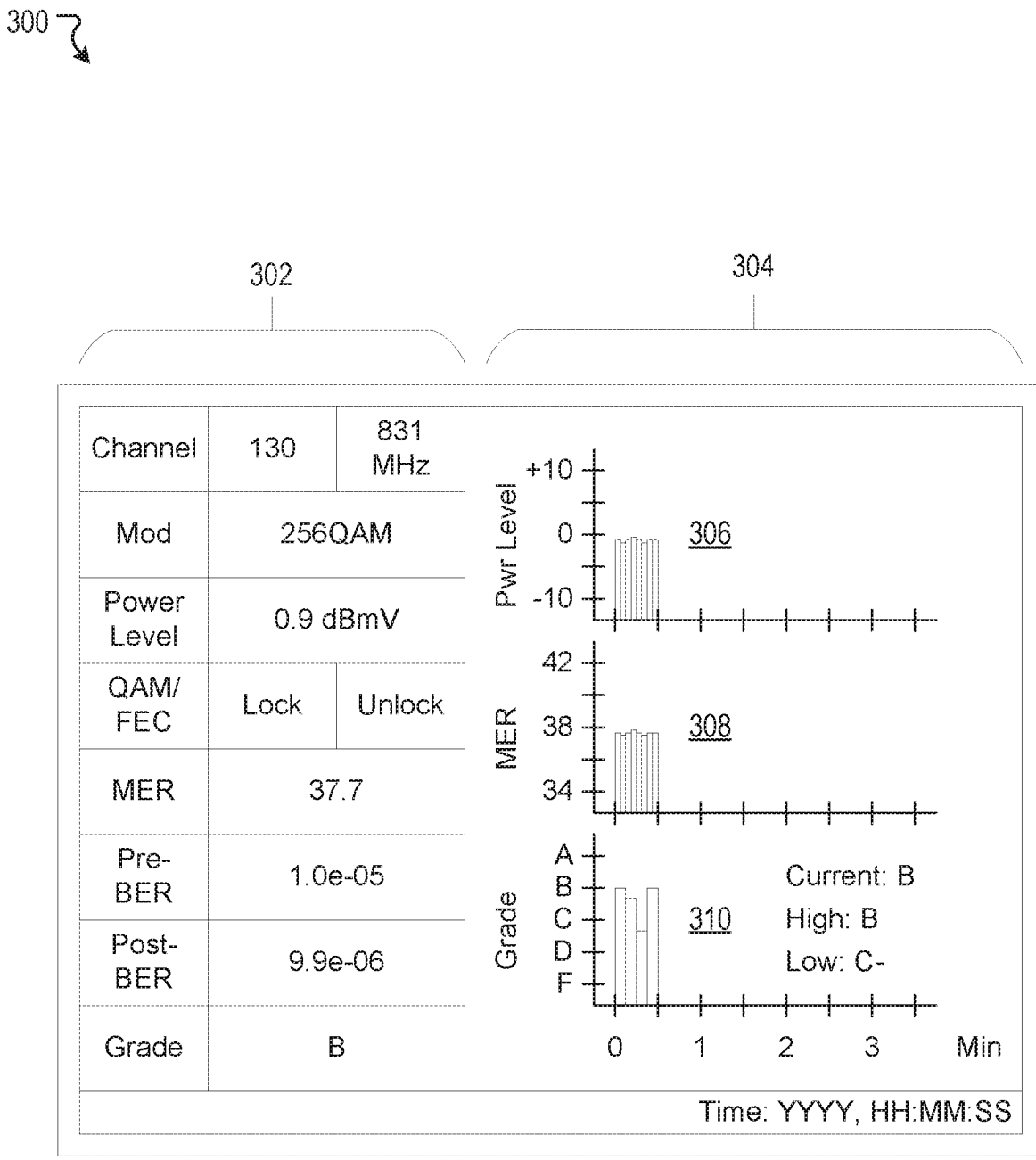
FIG. 3 illustrates an example interface, according to various embodiments of the present technology.

FIG. 3 illustrates an example interface 300, according to various embodiments of the present technology. In some embodiments, the example interface 300 can be implemented on a computing device (e.g., a specialized field device or a field meter for analyzing various aspects of a signal). As just one example, the computing device can be a cable TV signal-level meter with a built-in DOCSIS cable modem. In some cases, the example interface 300 can be implemented on a computing system remote from the computing device. In such cases, the computing system and the computing device may be communicatively coupled over a network. In some embodiments, the example interface 300 can be implemented on a display screen of a signal quality determination device (e.g., the signal quality determination device 210 of FIG. 2). In various embodiments, the example interface 300 may display various data fields 302 associated with a signal. The data fields 302 can include various characteristics and metrics associated with the signal. For example, as shown in FIG. 3, the data fields 302 can include an identification and a frequency of a channel ("Channel") of the signal (e.g., a subcarrier of the signal), a modulation type ("Mod") of the signal, power level of the signal, a modulation lock status ("QAM/FEC") of the signal, modulation error ratio ("MER") of the signal, pre-bit error ratio ("Pre-BER") and post-bit error ratio ("Post-BER") of the signal, and a grade of the signal. In some embodiments, the example interface 300 may display values associated with the characteristics and the metrics associated with the signal. For example, the data fields 302 can display values for the MER, the pre-BER, the post-BER, the power level, and the grade of the signal, as shown.

In some embodiments, the example interface 300 can include one or more plots 304 relating to the signal. The one or more plots 304 can be associated with the metrics of the signal. For example, as shown in FIG. 3, the one or more plots 304 can include a power level plot 306 and a MER plot 308. In some cases, the example interface 300 can be configured to further include a pre-BER plot and a post-BER plot. In some cases, the example interface 300 can be configured to include the pre-BER plot and the post BER plot in lieu of the power level plot 306 and/or the MER plot 308. Many variations are possible. In general, the one or more plots 304 can display historical or past values of the metrics of the signal. Based on the one or more plots 304, a field engineer or technician can determine one or more signal trends in the signal over time. In some embodiments, as shown in FIG. 3, the one or more plots 304 can further include a grade plot 310. Grades displayed in the grade plot 310, in some embodiments, can be determined based on a letter grading scheme, as discussed. For example, the grades can be determined based on overall scores computed based on the MER, the pre-BER and the post-BER, and power level of the signal. In some embodiments, the grade plot 310 can indicate a current grade of the signal, the highest grade and the lowest grade of the signal in a selected time period.

Figure 4:
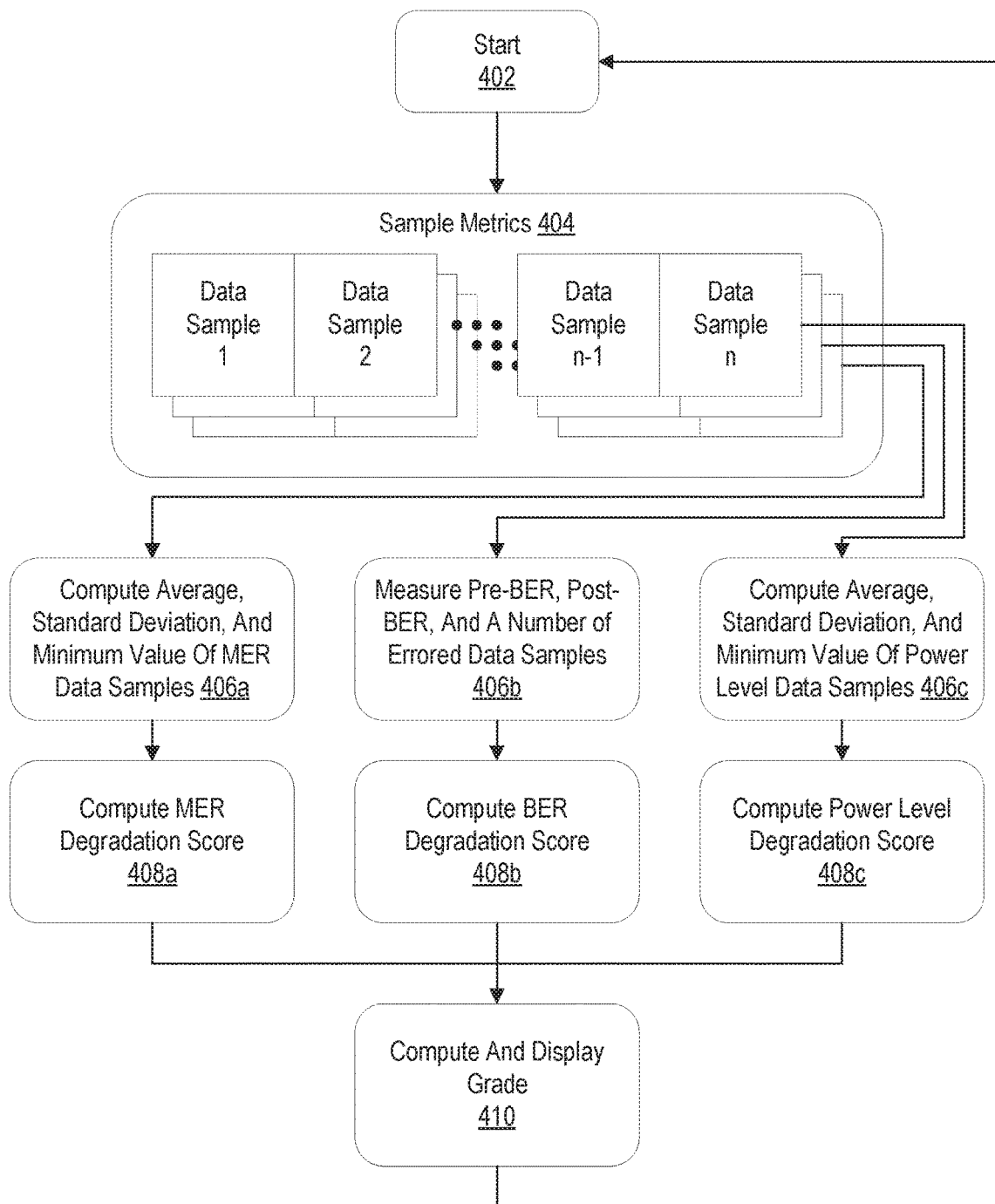
FIG. 4 illustrates a process for determining a grade of a signal, according to various embodiments of the present technology.

FIG. 4 illustrates a process 400 for determining a grade of a signal, according to various embodiments of the present technology. The process 400 starts at block 402. At block 404, the process 400 samples one or more data streams corresponding to one or more metrics associated with a signal at a selected sampling rate (e.g., 50 Hz). The metrics can include modulation error ratio (MER), pre-bit error ratio (pre-BER), post-bit error ratio (post-BER), and power level of the signal. A selected number (e.g., one hundred (100) data samples) are sampled from the one or more data streams. The process 400 then computes statistical values such as an average, a standard deviation, and a minimum value associated with MER and power level of the signal based on the data samples at blocks 406a and 406c, respectively. The process 400 further measures values corresponding to pre-BER and post-BER of the signal and determines a number of the data samples that contains pre-bit errors or post-bit errors at block 406b. At blocks 408a and 408c, the process 400 computes a MER degradation score and a power level degradation score based on the statistical values computed in blocks 406a and 406c, respectively. At block 408b, the process 400 computes a BER degradation score based on the values of pre-BER and post-BER and the number of the data samples containing bit errors determined in block 406b. At block 410, the process 400 determines the grade of the signal. The process 400 determines the grade based on an overall score computed based on the MER degradation score, the BER degradation score, and the power level degradation score. Once the grade of the signal is determined, the process 400 goes back to block 402 and repeats blocks 404 through 410 to determine a grade of the signal based on the next selected number (e.g., one hundred (100)) of data samples.

Figure 5:
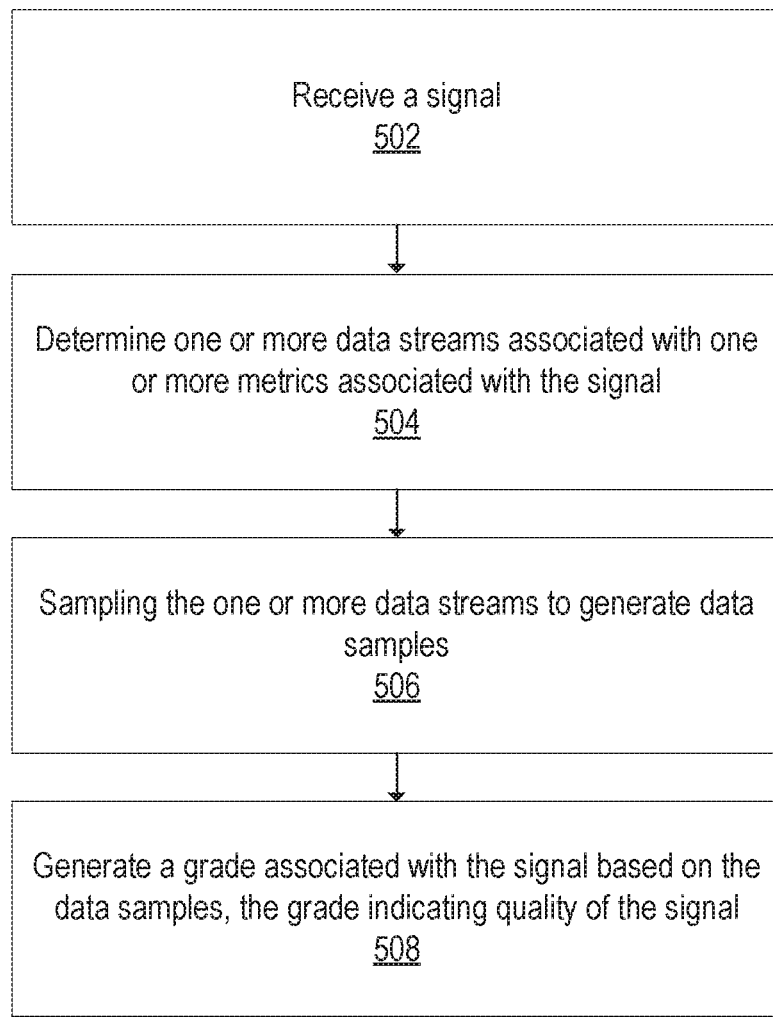
FIG. 5 illustrates an example method, according to an embodiment of the present technology.

FIG. 5 illustrates an example method 500, according to various embodiments of the present technology. It should be appreciated that there can be additional, fewer, or alternative steps performed in similar or alternative orders, or in parallel, within the scope of the various embodiments discussed herein unless otherwise stated.

At block 502, the example method 500 can receive a signal. At block 504, the example method 500 can determine one or more data streams associated with one or more metrics associated with the signal. At block 506, the example method 500 can sample the one or more data streams to generate data samples. At block 508, the example method 500 can generate a grade associated with the signal based on the data samples, the grade indicating quality of the signal. It is contemplated that there can be many other uses, applications, and/or variations associated with the various embodiments of the present technology.

Hardware Implementation

Figure 6:
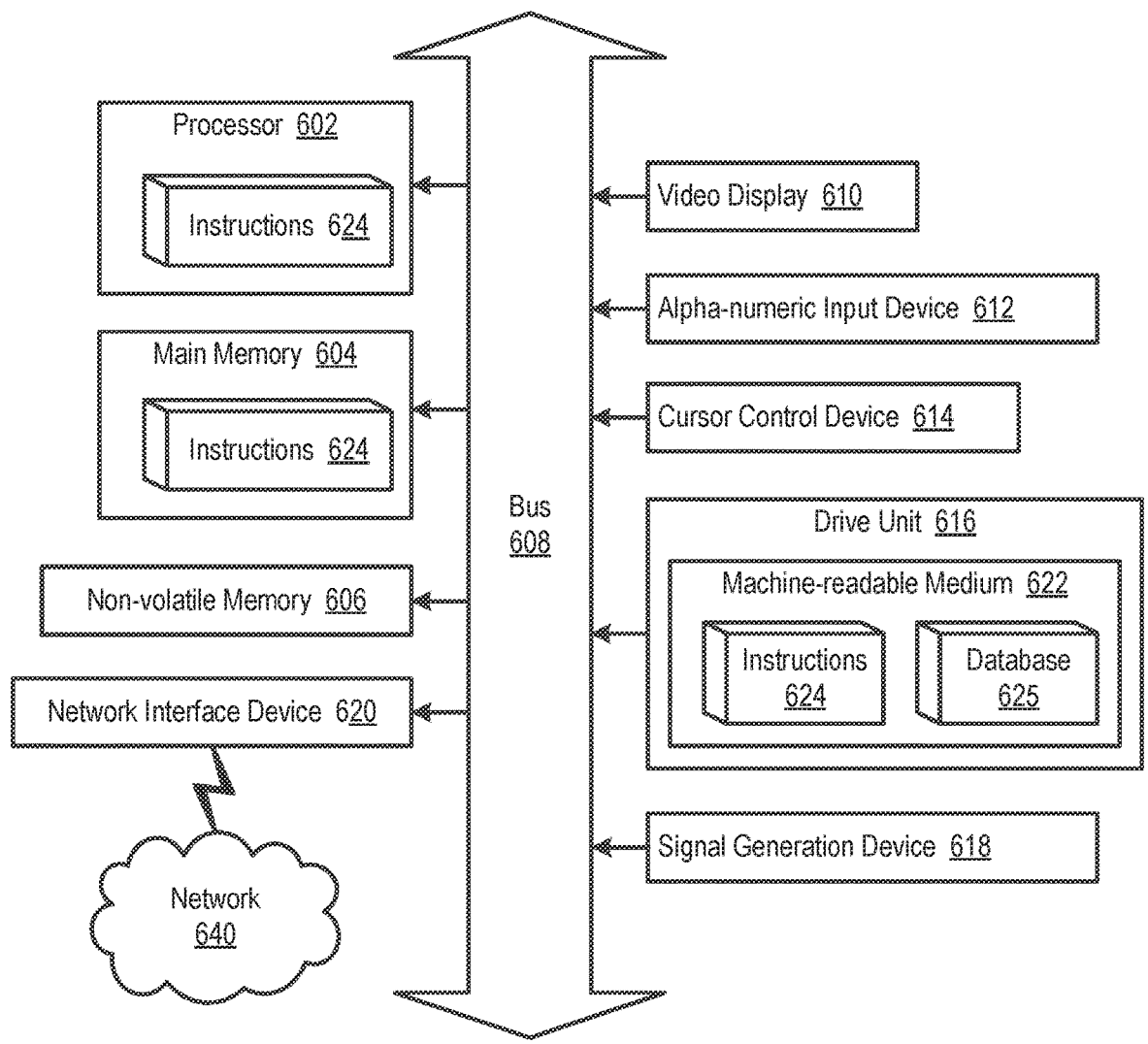
FIG. 6 illustrates an example of a computing system to implement one or more embodiments described herein, according to various embodiments of the present technology.

The foregoing processes and features can be implemented by a wide variety of machine and computing system architectures and in a wide variety of network and computing environments. FIG. 6 illustrates an example of a computing system (or computing device) 600 that may be used to implement one or more of the embodiments described herein according to various embodiments of the present technology. In some embodiments, the computing system 600 can implement the functionality of the signal quality determination module 102. The computing system 600 includes sets of instructions 624 for causing the computing system 600 to perform the processes and features discussed herein. The computing system 600 may be connected (e.g., networked) to other machines and/or computer systems. In a networked deployment, the computing system 600 may operate in the capacity of a server or a client machine in a client-server network environment, or as a peer machine in a peer-to-peer (or distributed) network environment.

The computing system 600 includes a processor 602 (e.g., a central processing unit (CPU), a graphics processing unit (GPU), or both), a main memory 604, and a nonvolatile memory 606 (e.g., volatile RAM and non-volatile RAM, respectively), which communicate with each other via a bus 608. In some embodiments, the computing system 600 can be a desktop computer, a laptop computer, personal digital assistant (PDA), or mobile phone, for example. In one embodiment, the computing system 600 also includes a video display 610, an alphanumeric input device 612 (e.g., a keyboard), a cursor control device 614 (e.g., a mouse), a drive unit 616, a signal generation device 618 (e.g., a speaker) and a network interface device 620.

In one embodiment, the video display 610 includes a touch sensitive screen for user input. In one embodiment, the touch sensitive screen is used instead of a keyboard and mouse. The disk drive unit 616 includes a machine-readable medium 622 on which is stored one or more sets of instructions 624 (e.g., software) embodying any one or more of the methodologies or functions described herein. The instructions 624 can also reside, completely or at least partially, within the main memory 604 and/or within the processor 602 during execution thereof by the computing system 600. The instructions 624 can further be transmitted or received over a network 640 via the network interface device 620. In some embodiments, the machine-readable medium 622 also includes a database 625.

Volatile RAM may be implemented as dynamic RAM (DRAM), which requires power continually in order to refresh or maintain the data in the memory. Non-volatile memory is typically a magnetic hard drive, a magnetic optical drive, an optical drive (e.g., a DVD RAM), or other type of memory system that maintains data even after power is removed from the system. The non-volatile memory 606 may also be a random access memory. The non-volatile memory 606 can be a local device coupled directly to the rest of the components in the computing system 600. A non-volatile memory that is remote from the system, such as a network storage device coupled to any of the computer systems described herein through a network interface such as a modem or Ethernet interface, can also be used.

While the machine-readable medium 622 is shown in an exemplary embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the present technology. Examples of machine-readable media (or computer-readable media) include, but are not limited to, recordable type media such as volatile and non-volatile memory devices; solid state memories; floppy and other removable disks; hard disk drives; magnetic media; optical disks (e.g., Compact Disk Read-Only Memory (CD ROMS), Digital Versatile Disks (DVDs)); other similar non-transitory (or transitory), tangible (or non-tangible) storage medium; or any type of medium suitable for storing, encoding, or carrying a series of instructions for execution by the computing system 600 to perform any one or more of the processes and features described herein.

In general, routines executed to implement the embodiments of the invention can be implemented as part of an operating system or a specific application, component, program, object, module or sequence of instructions referred to as "programs" or "applications." For example, one or more programs or applications can be used to execute any or all of the functionality, techniques, and processes described herein. The programs or applications typically comprise one or more instructions set at various times in various memory and storage devices in the machine and that, when read and executed by one or more processors, cause the computing system 600 to perform operations to execute elements involving the various aspects of the embodiments described herein.

The executable routines and data may be stored in various places, including, for example, ROM, volatile RAM, non-volatile memory, and/or cache memory. Portions of these routines and/or data may be stored in any one of these storage devices. Further, the routines and data can be obtained from centralized servers or peer-to-peer networks. Different portions of the routines and data can be obtained from different centralized servers and/or peer-to-peer networks at different times and in different communication sessions, or in a same communication session. The routines and data can be obtained in entirety prior to the execution of the applications. Alternatively, portions of the routines and data can be obtained dynamically, just in time, when needed for execution. Thus, it is not required that the routines and data be on a machine-readable medium in entirety at a particular instance of time.

While embodiments have been described fully in the context of computing systems, those skilled in the art will appreciate that the various embodiments are capable of being distributed as a program product in a variety of forms, and that the embodiments described herein apply equally regardless of the particular type of machine- or computer-readable media used to actually effect the distribution.

Alternatively, or in combination, the embodiments described herein can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

For purposes of explanation, numerous specific details are set forth in order to provide a thorough understanding of the description. It will be apparent, however, to one skilled in the art that embodiments of the technology can be practiced without these specific details. In some instances, modules, structures, processes, features, and devices are shown in block diagram form in order to avoid obscuring the description or discussed herein. In other instances, functional block diagrams and flow diagrams are shown to represent data and logic flows. The components of block diagrams and flow diagrams (e.g., modules, engines, blocks, structures, devices, features, etc.) may be variously combined, separated, removed, reordered, and replaced in a manner other than as expressly described and depicted herein.

Reference in this specification to "one embodiment," "an embodiment," "other embodiments," "another embodiment," "in various embodiments," or the like means that a particular feature, design, structure, or characteristic described in connection with the embodiment is included in at least one embodiment of the technology. The appearances of, for example, the phrases "according to an embodiment," "in one embodiment," "in an embodiment," "in various embodiments," or "in another embodiment" in various places in the specification are not necessarily all referring to the same embodiment, nor are separate or alternative embodiments mutually exclusive of other embodiments. Moreover, whether or not there is express reference to an "embodiment" or the like, various features are described, which may be variously combined and included in some embodiments but also variously omitted in other embodiments. Similarly, various features are described which may be preferences or requirements for some embodiments but not other embodiments.

Although embodiments have been described with reference to specific exemplary embodiments, it will be evident that the various modifications and changes can be made to these embodiments. Accordingly, the specification and drawings are to be regarded in an illustrative sense rather than in a restrictive sense. The foregoing specification provides a description with reference to specific exemplary embodiments. It will be evident that various modifications can be made thereto without departing from the broader spirit and scope as set forth in the following claims. The specification and drawings are, accordingly, to be regarded in an illustrative sense rather than a restrictive sense.

Although some of the drawings illustrate a number of operations or method steps in a particular order, steps that are not order dependent may be reordered and other steps may be combined or omitted. While some reordering or other groupings are specifically mentioned, others will be apparent to those of ordinary skill in the art and so do not present an exhaustive list of alternatives. Moreover, it should be recognized that the stages could be implemented in hardware, firmware, software, or any combination thereof.

It should also be understood that a variety of changes may be made without departing from the essence of the invention. Such changes are also implicitly included in the description. They still fall within the scope of this invention. It should be understood that this technology is intended to yield a patent covering numerous aspects of the invention, both independently and as an overall system, and in both method and apparatus modes.

Further, each of the various elements of the invention and claims may also be achieved in a variety of manners. This technology should be understood to encompass each such variation, be it a variation of an embodiment of any apparatus embodiment, a method or process embodiment, or even merely a variation of any element of these.

Further, the use of the transitional phrase "comprising" is used to maintain the "open-end" claims herein, according to traditional claim interpretation. Thus, unless the context requires otherwise, it should be understood that the term "comprise" or variations such as "comprises" or "comprising," are intended to imply the inclusion of a stated element or step or group of elements or steps, but not the exclusion of any other element or step or group of elements or steps. Such terms should be interpreted in their most expansive forms so as to afford the applicant the broadest coverage legally permissible in accordance with the following claims.

The language used herein has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the technology of the embodiments of the invention is intended to be illustrative, but not limiting, of the scope of the invention, which is set forth in the following claims.

What is claimed is:

1. A computer-implemented method comprising:
   receiving, by a computing system, a signal;
   determining, by the computing system, one or more data streams associated with one or more metrics associated with the signal;
   sampling, by the computing system, the one or more data streams to generate data samples; and
   generating, by the computing system, a grade associated with the signal based on the data samples, the grade indicating quality of the signal.

2. The computer-implemented method of claim 1, further comprising:
   providing, by the computing system, the one or more data streams for display through an interface; and
   providing, by the computing system, the grade associated with the signal for display through the interface.

3. The computer-implemented method of claim 2, wherein the interface includes one or more data fields and one or more plots, wherein at least one data field of the one or more data fields corresponds to at least one metric of the one or more metrics associated with the signal and at least one plot of the one or more plots corresponds to the grade associated with the signal.

4. The computer-implemented method of claim 1, wherein the one or more metrics associated with the signal include at least one of modulation error ratio, pre-bit error ratio, post-bit error ratio, or power level associated with the signal.

5. The computer-implemented method of claim 4, wherein the pre-bit error ratio includes bit errors that can be corrected by error correction and the post-bit error ratio includes bit errors that cannot be corrected by error correction.

6. The computer-implemented method of claim 5, wherein the error correction includes cyclic redundancy check.

7. The computer-implemented method of claim 4, wherein generating the grade associated with the signal based on the data samples comprises:
   computing statistical values corresponding to the modulation error ratio and the power level based on the data samples, the statistical values comprising at least one of an average, a standard deviation, or a minimum value; and
   computing a modulation error ratio degradation score for the modulation error ratio and a power level degradation score for the power level based at least in part on the statistical values corresponding to the modulation error ratio and the power level.

8. The computer-implemented method of claim 7, wherein generating the grade associated with the signal based on the data samples further comprises:
   measuring values corresponding to the pre-bit error ratio and the post-bit error ratio;
   determining pre-bit errors or post-bit errors associated with the data samples; and
   computing a bit error ratio degradation score based at least in part on the values corresponding to the pre-bit error ratio and the post-bit error ratio, and the pre-bit errors or the post-bit errors.

9. The computer-implemented method of claim 1, wherein the grade associated with the signal is assigned based on a letter grading scheme comprising A+, A, A−, B+, B, B−, C+, C, C−, D+, D, D−, and F.

10. The computer-implemented method of claim 1, wherein the signal includes an orthogonal frequency division multiplexing signal modulated using at least one of a 64-state quadrature amplitude modulation or a 256-state quadrature amplitude modulation.

11. A system comprising:
    at least one processor; and
    a memory storing instructions that, when executed by the at least one processor, cause the system to perform a method comprising:
      receiving a signal;
      determining one or more data streams associated with one or more metrics associated with the signal;
      sampling the one or more data streams to generate data samples; and
      generating a grade associated with the signal based on the data samples, the grade indicating quality of the signal.

12. The system of claim 11, wherein the instructions when executed cause the system to further perform:
    providing the one or more data streams for display through an interface; and
    providing the grade associated with the signal for display through the interface.

13. The system of claim 12, wherein the one or more metrics associated with the signal include at least one of modulation error ratio, pre-bit error ratio, post-bit error ratio, or power level associated with the signal.

14. The system of claim 13, wherein generating the grade associated with the signal based on the data samples comprises:
    computing statistical values corresponding to the modulation error ratio and the power level based on the data samples, the statistical values comprising at least one of an average, a standard deviation, or a minimum value; and
    computing a modulation error ratio degradation score for the modulation error ratio and a power level degradation score for the power level based at least in part on the statistical values corresponding to the modulation error ratio and the power level.

15. The system of claim 14, wherein generating the grade associated with the signal based on the data samples further comprises:
    measuring values corresponding to the pre-bit error ratio and the post-bit error ratio;
    determining pre-bit errors or post-bit errors associated with the data samples; and
    computing a bit error ratio degradation score based at least in part on the values corresponding to the pre-bit error ratio and the post-bit error ratio, and the pre-bit errors or the post-bit errors.

16. A non-transitory computer readable medium including instructions that, when executed by at least one processor of a computing system, cause the computing system to perform a method comprising:
    receiving a signal;
    determining one or more data streams associated with one or more metrics associated with the signal;
    sampling the one or more data streams to generate data samples; and
    generating a grade associated with the signal based on the data samples, the grade indicating quality of the signal.

17. The non-transitory computer readable medium of claim 16, wherein the instructions when executed cause the computing system to further perform:

providing the one or more data streams for display through an interface; and providing the grade associated with the signal for display through the interface.

18. The non-transitory computer readable medium of claim 17, wherein the one or more metrics associated with the signal include at least one of modulation error ratio, pre-bit error ratio, post-bit error ratio, or power level associated with the signal.

19. The non-transitory computer readable medium of claim 18, wherein generating the grade associated with the signal based on the data samples comprises:

computing statistical values corresponding to the modulation error ratio and the power level based on the data samples, the statistical values comprising at least one of an average, a standard deviation, or a minimum value; and computing a modulation error ratio degradation score for the modulation error ratio and a power level degradation score for the power level based at least in part on the statistical values corresponding to the modulation error ratio and the power level.

20. The non-transitory computer readable medium of claim 19, wherein generating the grade associated with the signal based on the data samples further comprises:

measuring values corresponding to the pre-bit error ratio and the post-bit error ratio;

determining pre-bit errors or post-bit errors associated with the data samples; and computing a bit error ratio degradation score based at least in part on the values corresponding to the pre-bit error ratio and the post-bit error ratio, and the pre-bit errors or the post-bit errors.

* * * * *